United States Patent [19]

Husted et al.

[11] Patent Number: 4,502,601
[45] Date of Patent: Mar. 5, 1985

[54] LOW FRICTION INSERTION FORCE RETAINER

[75] Inventors: Martin D. Husted, Van Nuys; Norman J. Schuster, Woodland Hills, both of Calif.

[73] Assignee: International Electronic Research Corp., Burbank, Calif.

[21] Appl. No.: 434,742

[22] Filed: Oct. 18, 1982

[51] Int. Cl.³ ............................................. A44B 21/00
[52] U.S. Cl. ........................................ 211/41; 211/89; 339/65; 339/75 MP; 361/415
[58] Field of Search ............................. 211/89, 41, 45; 339/75 MP, 65, 66; 361/399, 415

[56] References Cited

U.S. PATENT DOCUMENTS

| | | | |
|---|---|---|---|
| 3,665,370 | 5/1972 | Hartmann | 339/75 MP |
| 3,975,805 | 8/1976 | Spurling et al. | 211/41 X |
| 3,982,807 | 9/1976 | Anhalt et al. | 339/75 MP |
| 4,157,583 | 6/1979 | Basmajian et al. | 361/415 X |
| 4,354,770 | 10/1982 | Block | 361/415 X |

Primary Examiner—Robert W. Gibson, Jr.
Attorney, Agent, or Firm—Beehler, Pavitt, Siegemund, Jagger & Martella

[57] ABSTRACT

A guide for slidably accepting opposite edges of a sheet of material which may be an electronic circuit board or metal plate attached thereto and which makes use of a rotating camming bar in a retainer as a clamp has rotational stop and drive means built in a way to minimize servicing and replacement problems. On those occasions where the stop and drive means are pins, the bar and pins can be assembled prior to insertion in the retainer and bars can be individually removed and replaced. The pin relationship is furthermore such that any relative weakness in the structure is relegated to an exterior more easily accessible location to avoid unnecessary disassembly of parts when a bar needs repair or replacement.

25 Claims, 11 Drawing Figures

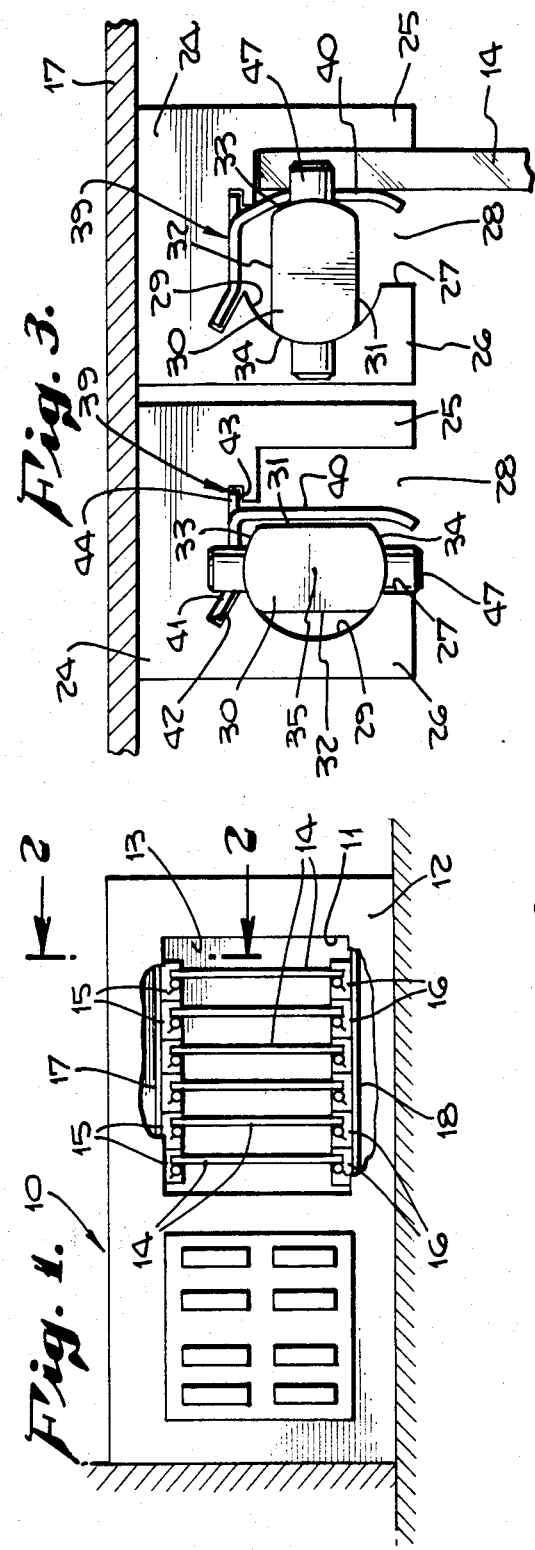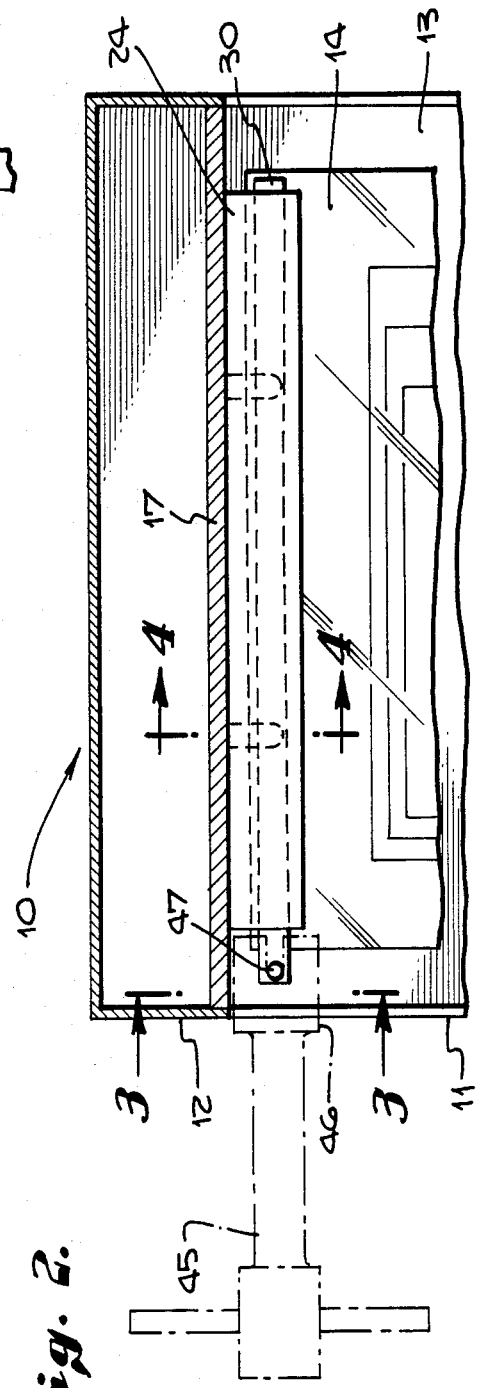

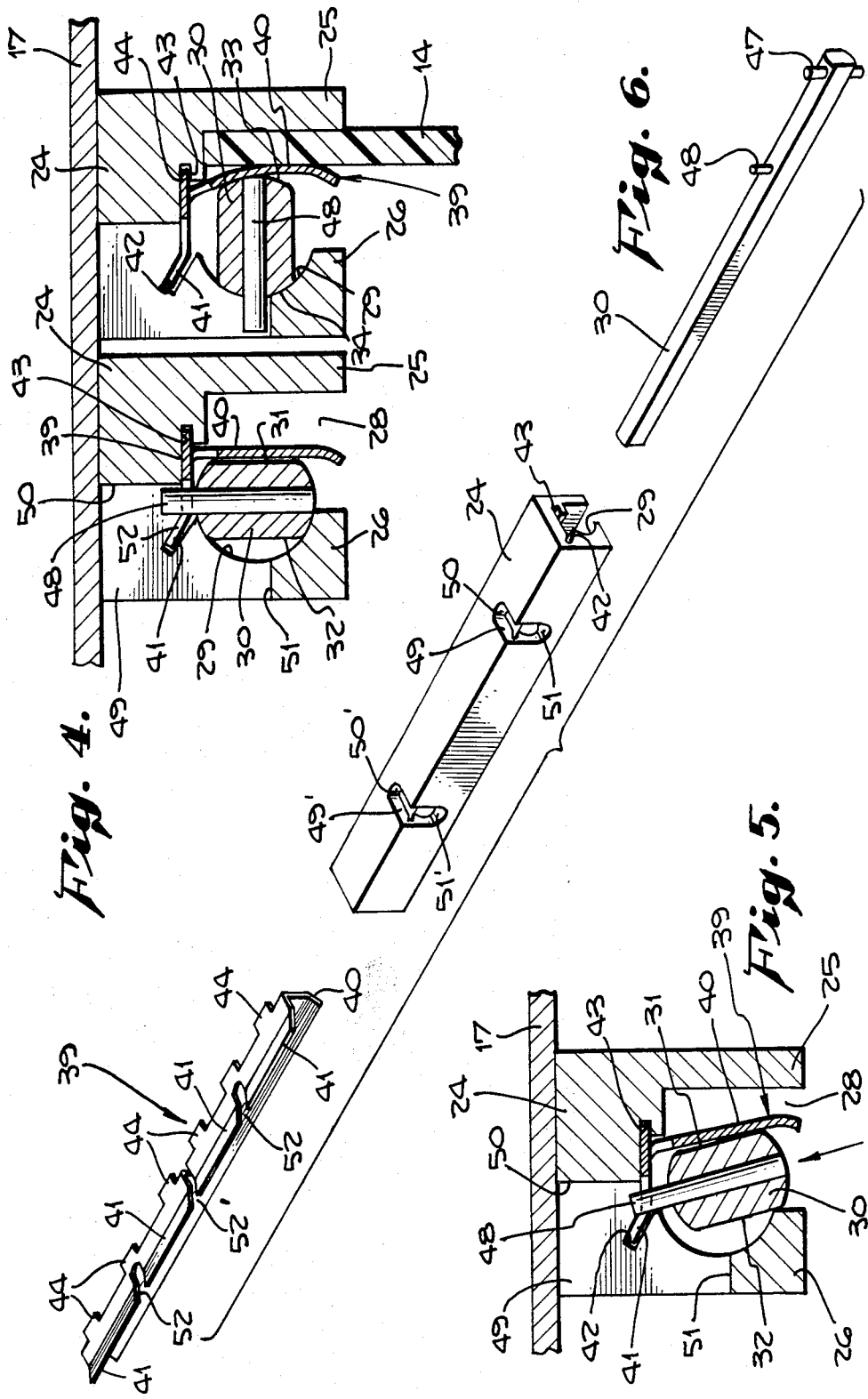

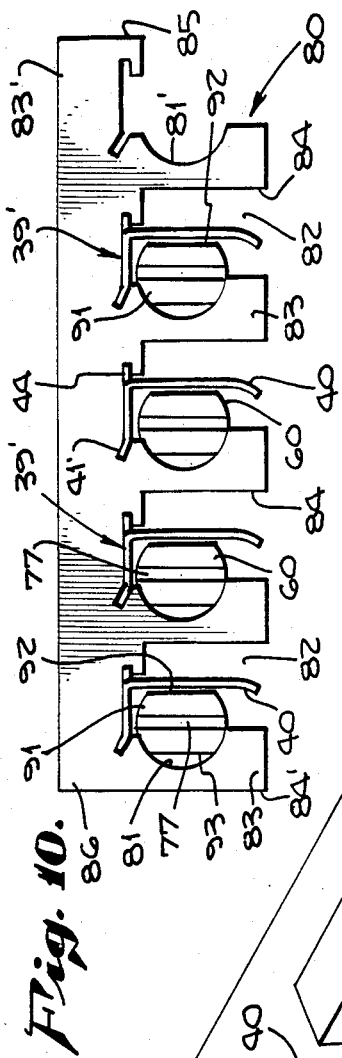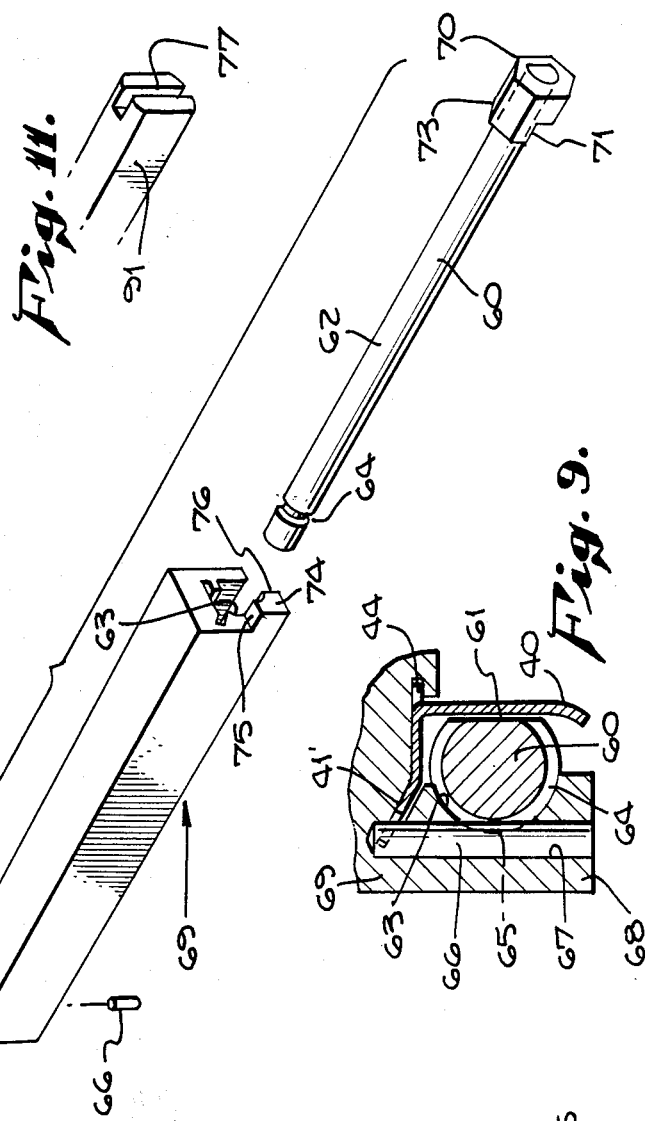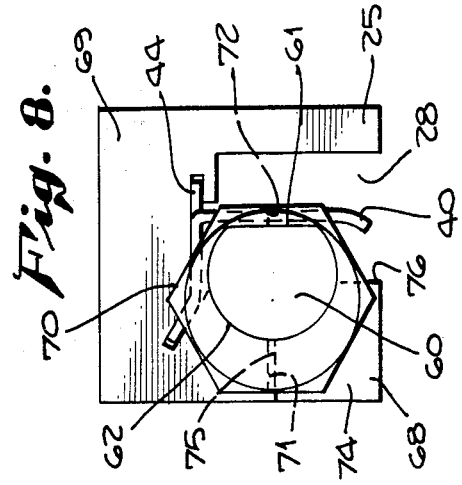

LOW FRICTION INSERTION FORCE RETAINER

The low friction insertion force retainer is predominantly used as a mounting for a battery of printed electronic circuit boards and is especially advantageous where there is need for dissipation of heat generated during operation of the circuits. Customarily the boards need to be contained within a housing, of box-like configuration, where, on opposite inside walls, retainers are mounted in pairs for retaining opposite parallel edges of the boards. Although spacing heretofore between boards has tended to be generous, there has been a progressive demand to have boards compacted in closer relationship in order to have more circuit boards effectively mounted within a single housing. Additional compacting is experienced as boards tend to be thinner, lighter and smaller which has resulted from continued improvements not only in the manufacture of boards, but also the components which are interconnected by the printed circuits.

Among demands experienced in the mounting of circuit boards, in addition to increased capacity of the housing and retainers, is the need for quickly anchoring each board in turn as it is placed in the housing in a secure manner so that, irrespective of where and how the housing might ultimately be mounted or carried, the retention of the boards will remain secure. Disturbing conditions such as vibration, moisture, variations in heat and cold and comparable physically disturbing circumstances must be guarded against in the type of retainer which is made use of.

Further still, no matter with what degree of care retainers are initially built, assembled and placed in operation, servicing problems do arise, making it necessary from time to time to remove one or more or, on some occasions, all of the circuit boards and to replace them with others. For that reason, an appreciable amount of flexibility is required so that any one or more boards can be quickly released, removed and thereafter replaced. There is furthermore always the prospect that a retainer may become defective to the extent that the clamping action can no longer be depended upon. For that reason the design of the retainer needs to be such that movable parts can readily be removed and replaced. Further still, if there is likelihood of parts being broken while in use, it is especially important that the design be such as to make possible quick and ready removal of broken parts without need for dismantling portions of the installation. Additionally, for installations which depend upon parts which need to be adjusted by hand, as by application of a torque, there is always the prospect of overtorquing, causing damage to the installation which should be avoided, and not all personnel, however experienced, handle tools in the same fashion. When a circuit board needs to be removed and replaced, the operation should be possible without need for calling upon special tools and special handling in order to do the job quickly and effectively. This is an improvement upon U.S. Pat. No. 3,975,805.

It is therefore among the objects of the invention to provide a new and improved low friction insertion force retainer for units of the character of printed electronic circuit boards wherein the operating and retaining parts of which are simple and inexpensive in character while at the same time positive acting both when moved into clamping position and thereafter when moved to release position.

Another object of the invention is to provide a new and improved low friction insertion force retainer in which the camming rod members can be completely assembled before being mounted in the retainer and the housing and merely snapped into position for operation, thereafter to be as readily dislodged in the event of a servicing need.

Still another object of the invention is to provide a new and improved low friction insertion force retainer wherein although the retainers need to be positioned in a left-hand/right-hand relationship, a single retainer is so constructed that it can be used with equal effectiveness on either side.

Still another object of the invention is to provide a new and improved low friction insertion force retainer which is of such construction that any relatively weaker points which may be inherent in the structure are placed in relatively exterior and available locations so that in the event of a break, the broken parts may be readily removed for replacement by an equally effective piece of apparatus.

Still another object of the invention is to provide a new and improved low friction insertion force retainer which can be operated to clamp and unclamp devices such as printed circuit boards without requiring the use of a special tool.

Still another object of the invention is to provide a new and improved low friction insertion force retainer of a construction such that the clamping torque is substantially uniform throughout the entire clamping area, the clamping elements being such as to have a minimum of yielding effect so that the serviceman can in a sense "feel" application of the torquing force and be assured of a proper clamping action.

Still further among the objects of the invention is to provide a new and improved low friction insertion force retainer of a character such that retainers can be built in multiple units in a manner making most advantageous use of available space and also minimize assembly operations to the extent that multiple sets of retainers can be made as a unitary block and further made in such a manner that blocks can be stacked one upon the other, in that fashion to provide a multiple number of pairs of retainers adapted to readily mount a multiple number of circuit boards in an effective manner.

With these and other objects in view, the invention consists of the construction, arrangement and combination of the various parts of the device, serving as an example only of one or more embodiments of the invention, whereby the objects contemplated are obtained as hereinafter disclosed in the specification and drawings and pointed out in the appended claims.

In the drawings:

FIG. 1 is a plan view of a typical housing for a multiple arrangement of circuit boards mounted by use of the retainers.

FIG. 2 is a fragmentary longitudinal sectional view on the line 2—2 of FIG. 1.

FIG. 3 is a fragmentary cross-sectional view on the line 3—3 of FIG. 2.

FIG. 4 is a fragmentary cross-sectional view on the line 4—4 of FIG. 2.

FIG. 5 is a fragmentary cross-sectional view suggesting the manner in which a rod member can be inserted and removed.

FIG. 6 is an exploded view of a single type of retainer.

FIG. 7 is an exploded view of a modified form of a single type retainer.

FIG. 8 is an end elevational view of a retainer of the type shown in FIG. 7, in assembled condition.

FIG. 9 is a fragmentary cross-sectional view of the assembled retainer of the type of FIG. 7 taken at the location of the retention pin.

FIG. 10 is an end elevational view of a type of multiple unit block capable of being stacked to accommodate a large number of boards.

FIG. 11 is an end perspective view of the camming rod of FIG. 10.

In an embodiment of the invention chosen for the purpose of illustration there is shown by way of example a housing 10 in which there is an opening 11 in a panel 12 to a chamber 13 to accommodate a plurality of sheets 14 of material as, for example, printed electronic circuit boards held by opposite left and right-hand retainers 15 and 16 mounted on interior walls 17 and 18 in a conventional manner such as by adhesive bonding, riveting, brazing or bolting.

In the embodiment of the invention of FIGS. 1 through 6, inclusive, the retainers 15 and 16, exemplified in some detail by the left retainer 15, comprises a body 24 in the form of a block of appropriate metallic material, frequently an aluminum alloy. The blocks are adapted to be mounted in pairs upon the adjacent side wall 17, as exemplified in FIGS. 2 and 3, by appropriate conventional means. On some occasions the box may be brazed to the side wall. On other occasions threaded apertures may be provided to accommodate screws extending through the side wall and into the block. The blocks are mounted on the wall in positions as close together as is feasible in the chosen construction so as to fill the chamber 13 to capacity with the sheets 14. Alternatively, the sheet 14 may be a metal heat conducting plate on which a printed circuit board is mounted so that component heat may be removed to the edge for eventual conduction into the retainer and thus into the walls of the box 17 and 18.

The blocks are each formed so as to provide a flange 25 against which the sheet 14 or metal plate attached thereto is adapted to be pressed. On the side of the block opposite from the flange 25 is a section 26, an edge face 27 of which is spaced from the corresponding flange 25 in order to provide a slot 28 for initial reception of the sheet 14. The section 26 is also provided with a pocket 29 which extends throughout the length of the block and which, as a matter of structural and operative convenience, may be arcuate in cross-sectional configuration. The body or block 24 in company with the respective flange 25 and section 26 may be considered as a rack for retention and accommodation of a rod member 30 which provides the clamping and unclamping action to retain the sheet 14.

In the embodiment of FIGS. 1 through 6, inclusive, the rod member is a solid metallic member of an appropriate material such as an aluminum alloy or, on occasions, stainless steel, aluminum being preferred for price considerations when structural details do not require a rod of greater strength. As noted from FIG. 6, the rod member extends throughout the full length of the body represented by the block 24.

In this form of the invention the rod member 30 is provided with opposite parallel flat clearance faces 31 and 32. Intermediate the clearance faces are respective camming surfaces 33 and 34. The camming surfaces are arcuate with respect to a common axis of rotation 35.

Acting in part to hold the rod member 31 within the pocket 29 is a leaf spring member, indicated generally by the reference character 39 and shown in perspective in FIG. 6. The leaf spring member is provided on one side with a leaf 40 coextensive with the length of the block. The leaf 40 occupies a position between the clearance face 31 and the flange 25, partly filling the slot 28 as a result of the thickness of the leaf. To hold the leaf spring member in position, the body or block is provided with one obliquely extending recess 42 and a second recess 43. Leaves 41 of the spring member 39 extend into the obliquely directed recess 42. Tabs 44 on the opposite side are retained in the second recess 43.

In initial position the leaves 40 are urged resiliently in a direction from right to left, as viewed in FIG. 3, to a location where they can bear against the clearance face 31, hold the rod member 30 in its position within the pocket 29, and at the same time provide sufficient clearance in the slot 28 of breadth greater than the thickness of the sheet 14 so that the sheet can be slid into the slot with an ultimate minimum amount of frictional resistance approaching zero. Once the board is in position, the rod member 30 is rotated approximately ninety degrees about its axis of rotation so as to bring one of the camming surfaces 33 or 34 into engagement with the leaves 41 and tilt the leaves resiliently into engagement with the adjacent edge surface of the circuit board, as shown in the left-hand version of FIG. 3. In this manner camming action of the rod member locks the circuit board in a position of engagement with the flange 25. Rotation of the rod member 30 is accomplished by use of a tool 45, a slotted end 46 of which engages a drive pin 47 extending transversely through the adjacent end of the rod member 30.

To limit rotation of the rod member 30 to approximately the desired ninety degrees, there is provided a stop pin 48 which also extends transversely through the rod member 30 at a location spaced from the drive pin 47. To accommodate the stop pin there is a stop slot 49 in the block 24 at opposite ends of which are stop shoulders 50 and 51. There is also provided a second stop slot 49' in the same block 24 with appropriate stop shoulders 50' and 51' but for use only when the same block 24 is to be used on the opposite side of the chamber 23 to accommodate the opposite side of the sheet 14. Apertures 52 separated by the leaves 41 are so located that they coincide with the stop slots 49, 49' and accommodate the stop pin 48 during movement from one position to the other. This also acts to retain the spring in the housing. In some applications it may be desirable to use two stop pins 48 at locations employing both stop slots 49 and 49', only one stop pine being shown. One such case is with a very long unit. In this instance two partial springs may be desired instead of one long one so as to reduce very high torque forces needed for clamping. Under such circumstances two stop pins 48 will be needed to retain the two separate springs by these two pins resting in two apertures 52 when the retainer is not locked. An aperture 52' is located intermediate the apertures 52, 52.

It is also of consequence to note that the stop pin 48 is of diameter smaller than the diameter of the drive pin 47. This means that the hole in the rod member 30 for the stop pin is smaller than the hole for the drive pin 47, resulting in the rod itself being stronger where drilled for the stop. pin than for the drive pin. As a consequence, the relative weakness is at the outer or exposed end so that if there should be any prospect of the rod ultimately weakening and breaking, the break will be prone to occur at the outer accessible end, making the rod which has broken more easily removable and replaceable.

It is further of consequence to note that the rod thickness measured transversely between the clearance faces 31 and 32 is less than the breadth of the slot 28, taking into consideration the thickness of the leaf 40. This means that the rod 30 can be pushed into position through the slot 28, as suggested in FIG. 5, and also removed, by deflecting the spring without disturbing the anchored position of the block 24 on the wall 17. A further consequence of this construction is that both the drive pin 47 and the stop pin 48 can be assembled with the rod member 30 exteriorly and the assembled rod member thereafter pushed laterally into position through the slot 28 when the retainer is initially assembled. This also makes possible to withdraw any single rod member at any time after assembly for servicing or repair without need for disturbing the assembly of any other rod member in the group, and naturally without need for dislodging the block 24 from its anchored position on the wall which may not be possible if it is brazed in place.

In the embodiment of the invention shown in FIGS. 7, 8 and 9, a slightly different form of camming rod member 60 is made use of. On this occasion there is only one clearance face 61 which is relatively flat and extends throughout the length of the rod member. The remainder of the arcuate surface 62 of the rod member provides the camming surface. On this occasion to retain the rod member 60 against endwise movement within the appropriate pocket 63, the rod member is provided with an arcuate recess 64 adjacent one end for reception of an inwardly exposed midportion 65 and a retention pin 66. The retention pin extends through an appropriate hole 67 in a wall section 68 of a block 69 serving as the body. The retention pin 66 extends so as to retain the spring 40 once the pin 66 is installed by picking up a suitable notch in the spring 40.

On this occasion the block 69 has in it the pocket 63 which is substantially of the same form, configuration and dimensions as the pocket 29 of the first described form of the invention. In this instance there is an aperture 52', intermediate leaves 41', 41".

In the form of invention in FIGS. 7, 8 and 9, instead of making use of a drive pin, there may be provided a hexagonal head 70 at the outside end of the rod member 60 which can be manipulated by a conventional wrench. In order to accommodate the entry of the sheets into the retainer, the hexagonal head 70 is eccentrically located on the rod member 60. In order to provide stop means at opposite ends of the substantially ninety degree rotation, there are provided stop shoulders 71 and 72 at a 180° interval on a partial extension 73. A complementary projection 74 of the block 69 provides stops 75 and 76 in a 90° disposition to allow a 90° rotation of the rod 60.

As an alternative to the hexagonal head 70 and also to accommodate substantially conventional tools, there may be provided a screwdriver slot 77 as a means for rotating rod member 60 throughout its ninety degree rotation for clamping and unclamping the sheet 14.

For a more closely packed arrangement to accommodate a larger number of printed circuit boards 14 within a given space, the unitary arrangement shown in the form of invention of FIGS. 10 and 11 is made use of. In this form there is proposed a multiple body unit 80 of integral material containing a plurality of pockets 81 and slots 82. Although four such slots are shown in the multiple body unit, the number may vary depending upon circumstances. In this arrangement body sections 83 which separate the slots 82 provide at the same time flange surfaces 84 for one of the slots 82 and recesses for the pockets 81 of the next adjacent slot. The body units 80 are adapted to be mounted in the housing on appropriate walls in the same conventional manner as the retainers 15 and 16 first made reference to.

As a further accommodation to multiple mounting, an endmost body section 83', at the right end, for example, of FIG. 10, may provide a pocket 81' but be devoid of the corresponding flange providing one of the slots 82 previously made reference to. An end face 85 is provided at a location adapted to be coincident with an end face such as the end face 86 at the opposite end of the body, or the adjacent end of the most nearly adjacent body, which would be coincident with a flange surface 84'. When the corresponding multiple body units are joined together end to end, the stacking of such multiple body units can naturally be repeated to the extent applicable in a given installation.

Because of the close spacing of the slots 82 of this form of the device, it become desirable to use screwdriver slots 77 of the kind previously made reference to and to use rod members 91 having opposite flat parallel clearance faces 92 and 93 of the type heretofore described. The corresponding dimensioning of the narrow breadth of the rod member makes possible lateral insertion of the rod member through the corresponding slot 82 and removal in the same fashion of any rod member despite the multiple arrangement made reference to. The leaf spring members 39' have the same form, shape and configuration as those heretofore made reference to.

By incorporating in a low insertion force retainer a rod of one or another of the forms of invention herein described, the sheet 14 can be firmly locked into position with a ninety degree rotation of the rod. Approximately 100 pounds per square inch of clamping pressure may readily be exerted along the entire length of the board edge. The clamping pressure thus provided is adapted to secure circuit board retention effectively with a very low interface thermal resistance from the circuit board to the corresponding retainer and accordingly provide for ready transfer of heat to the colder exterior. A highly efficient thermal link is provided.

The camming action is furthermore one which can accommodate a tolerance of up to plus or minus 0.005 inches of sheet thickness, depending on length, without sacrificing retention strength and the ability to transfer heat. The harmful effect of overtorquing is also minimized.

While particular embodiments of the present invention have been shown and described, it will be obvious to those skilled in the art that changes and modifications may be made without departing from the invention in its broader aspects and, therefore, the aim of its appended claims is to cover all such changes and modifications as fail within the true spirit and scope of the invention.

Having described the invention, what is claimed as new in support of Letters Patent is as follows:

1. A low insertion force retainer for gripping relatively flat edge portions comprising a housing incorporating elongated racks for engagement with respective edge portions, each rack comprising a flange extending lengthwise of the rack for retention of said edge portion, a clamp assembly extending lengthwise of the rack and in spaced relationship with said flange whereby to provide a slot of breadth in excess of the thickness of said edge portion for reception of said edge portion, said clamp assembly comprising a rod member, said rack having an elongated pocket adjacent said slot for retention of said rod member in a position for rotation about an axis of rotation, at least one clearance face on said rod member at a fixed distance from the axis of rotation whereby when said clearance face is in an initial position facing said flange the distance between said clearance face and said flange is in excess of the thickness of said relatively flat edge portion, a camming surface on said rod member adjacent said clearance face at a distance from the axis of rotation greater than the distance between said clearance face and the axis of rotation whereby when the rod member is in a position of rotation removed from said initial position said camming surface will have a camming action against said edge portion for retention of said edge portion in the slot, said rod member having a relatively lesser thickness in a direction normal to said clearance face which is smaller than the breadth of said slot, whereby to enable lateral insertion and removal of said rod from said pocket.

2. A low insertion force retainer as in claim 1 wherein there is a stop pin extending through said rod member in a transverse direction intermediate opposite ends of the rod member, said rod member having a weakened section at the location of said stop pin, a drive means at one end of the rod member, said rod means having a weakened section at the location of said drive means, the rod member having a greater resistance to breaking at the location of said stop pin than at the location of said drive means.

3. A low insertion force retainer as in claim 2 wherein the stop pin is more nearly adjacent one end than the other of said rod member and there are two stop slots in the body for reception of the stop pin alternatively in right-hand or left-hand attitude.

4. A low insertion force retainer as in claim 3 wherein said resilient means comprises a leaf spring member having one leaf in resilient engagement with the body and another leaf in said slot at a location between said flange and said clearance face and there are slots in the leaf spring at locations coincident with the locations of the stop slots for implementation of spring retention.

5. A low insertion force retainer as in claim 2 wherein the drive means is a pin.

6. A low insertion force retainer as in claim 2 wherein the drive means is a nut.

7. A low insertion force retainer as in claim 1 wherein said rod member has a recess in the circumferential wall and there is a projection on the body within the pocket complementary with respect to the recess and extending into the recess whereby said rod member is retained against endwise movement in said pocket.

8. A low insertion force retainer as in claim 7 wherein said recess extends circumferentially around the rod member and said projection is a pin extending from the body into the pocket.

9. A low insertion force retainer as in claim 1 wherein rotation of the rod member between initial position and camming position is an angular distance of not less than 90°.

10. A low insertion force retainer for gripping relatively flat edge portions comprising a housing incorporating elongated racks for engagement with respective edge portions, each rack comprising a body having a flange extending lengthwise of the rack for retention of said edge portion, a clamp assembly extending lengthwise of the rack and in spaced relationship with said flange whereby to provide a slot of breadth in excess of the thickness of said edge portion for reception of said edge portion, said clamp assembly comprising a rod member, said body having an elongated pocket adjacent said slot for retention of said rod member in a position for rotation about an axis of rotation, at least one clearance face on said rod member at a fixed distance from the axis of rotation whereby when said clearance face is in an initial position facing said flange the distance between said clearance face and said flange is in excess of the thickness of said relatively flat edge portion, a camming surface on said rod member adjacent said clearance face at a distance from the axis of rotation greater than the distance between said clearance face and the axis of rotation whereby when the rod member is in a position of rotation removed from said initial position said camming surface will have a camming action against said edge portion for retention of said edge portion in the slot, said rod member having a relatively lesser thickness in a direction normal to said clearance face which is smaller than the breadth of said slot, whereby to enable lateral insertion and removal of said rod from said pocket, and resilient means acting between said body and said rod member in a direction adapted to releasably retain said rod member in said pocket.

11. A low insertion force retainer as in claim 10 wherein said resilient means comprises a leaf spring member having one leaf in releasable engagement with the body and another leaf in said slot at a location between said flange and said clearance face, said other leaf having a thickness less than the difference between the breadth of said slot and said relatively lesser thickness of said rod.

12. A low insertion force retainer as in claim 10 wherein said housing comprises a multiple body unit of integral material containing a plurality of pockets on one side of said unit, each pocket having a laterally open slot in communication therewith, there being a rod member in each of said pockets.

13. A low insertion force retainer as in claim 12 wherein a body portion containing one pocket is at the same time a body portion comprising the flange of the next adjacent slot.

14. A low insertion force retainer as in claim 12 wherein the rod members have oppositely located diametrically spaced and relatively flat clearance faces.

15. A low insertion force retainer as in claim 12 wherein there is a plurality of said multiple body units, an end of one of said multiple body units including means forming a pocket and including complementary partial structural portions for the corresponding slot of the next adjacent multiple body unit.

16. A low insertion force retainer for gripping relatively flat edge portions comprising a housing incorporating elongated racks for engagement with respective edge portions, each rack comprising a body having a flange extending lengthwise of the rack for retention of said edge portion, a clamp assembly extending lengthwise of the rack and in spaced relationship with said flange whereby to provide a slot of breadth in excess of the thickness of said edge portion for reception of said edge portion, said clamp assembly comprising a rod member, said body having an elongated pocket adjacent said slot for retention of said rod member in a position for rotation about an axis of rotation, at least one clearance face on said rod member at a fixed distance from the axis of rotation whereby when said clearance face is in an initial position facing said flange the distance between said clearance face and said flange is in excess of the thickness of said relatively flat edge portion, a camming surface on said rod member adjacent said clearance face at a distance from the axis of rotation greater than the distance between said clearance face and the axis of rotation whereby when the rod member is in a position of rotation removed from said initial position said camming surface will have a camming action against said edge portion for retention of said edge portion in the slot, said rod member having a relatively lesser thickness in a direction normal to said clearance face which is smaller than the breadth of said slot, whereby to enable lateral insertion and removal of said rod member from said pocket, drive means on said rod member comprising a nut, wherein there is a projection on the nut which is offset with respect to the axis of rotation whereby to provide a stop, and shoulder means on said body engageable with said stop.

17. A low insertion force retainer as in claim 16 wherein said shoulder means comprises shoulders extending endwardly of said body, said shoulders being spaced apart an angular distance of about 90° and respectively engageable with the stop on said nut.

18. A low insertion force retainer for gripping relatively flat edge portions comprising a housing incorporating elongated racks for engagement with respective edge portions, each rack comprising a body having a flange extending lengthwise of the rack for retention of said edge portion, a clamp assembly extending lengthwise of the rack and in spaced relationship with said flange whereby to provide a slot of breadth in excess of the thickness of said edge portion for reception of said edge portion, said clamp assembly comprising a diametrically non-compressible rod member, said body having an elongated pocket adjacent said slot for retention of said rod member in a position for rotation about an axis of rotation, at least one clearance face on said rod member at a fixed distance from the axis of rotation whereby when said clearance face is in an initial position facing said flange the distance between said clearance face and said flange is in excess of the thickness of said relatively flat edge portion, a camming surface on said rod member adjacent said clearance face at a distance from the axis of rotation greater than the distance between said clearance face and the axis of rotation whereby when the rod member is in a position of rotation removed from said initial position said camming surface will have a camming action against said edge portion for retention of said edge portion in the slot, and leaf spring means comprising a first leaf in retention engagement with the body and a second leaf angularly disposed relative to said first leaf and at a location between said flange and said rod member and adapted to be urged into retaining position relative to said edge portion in response to camming action by said rod member.

19. A low insertion force retainer as in claim 18 wherein the retainer comprises a set of multiple rack assemblies on each side of the retainer, said rack assemblies comprising a plurality of flanges extending inwardly of the housing on each side spaced from each other at fixed locations for retention of the edge portions, a camming rod member for each flange, and a body for each camming rod member bearing an elongated pocket therein for the respective camming rod member.

20. A low insertion force retainer as in claim 19 wherein there is a single clearance face on each camming rod member and the remaining circumferential portion of the camming rod member is an arcuate camming surface.

21. A low insertion force retainer as in claim 19 wherein captive ends of said flanges of each set are integrally interconnected.

22. A low insertion force retainer as in claim 18 wherein there is a second clearance face on the rod parallel to the first identified clearance face.

23. A low insertion force retainer as in claim 18 wherein there is a stop pin extending through said rod member in a transverse direction intermediate opposite ends of the rod member, a drive means at one end of the rod member, the rod member having a greater resistance to breaking at the location of said stop pin than at the location of said drive means.

24. A low insertion force retainer as in claim 23 wherein the stop pin is more nearly adjacent one end than the other of said rod member and there are two stop slots in the body for reception of the stop pin alternatively in right-hand or left-hand attitude, and slots in the leaf spring at locations coincident with the locations of the stop slots for implementation of spring retention.

25. A low insertion force retainer as in claim 18 wherein said housing comprises a multiple body unit of integral material containing a plurality of pockets on one side of said unit, each pocket having a laterally open slot in communication therewith, there being a rod member in each of said pockets and wherein a body portion containing one pocket is at the same time a body portion comprising the flange of the next adjacent slot.

* * * * *